United States Patent [19]

Schraivogel et al.

[11] Patent Number: 5,061,984
[45] Date of Patent: Oct. 29, 1991

[54] SUBSTRATE AND DEVICE COMPRISING INTERCONNECTION STRUCTURES

[75] Inventors: Rainer A. Schraivogel, Wettingen, Switzerland; Cornelis G. M. Van Kessel, Eindhoven; Jan Bouwma, Heerlen, both of Netherlands

[73] Assignee: U.S. Philips Corporation, New York, N.Y.

[21] Appl. No.: 496,477

[22] Filed: Mar. 20, 1990

[30] Foreign Application Priority Data

Mar. 20, 1989 [NL] Netherlands ................ 8900676

[51] Int. Cl.$^5$ .................. H01L 23/48; H01L 29/44; H01L 29/52; H01L 29/40
[52] U.S. Cl. ............................... 357/68; 357/65; 357/69
[58] Field of Search ............... 357/80, 81, 71, 79, 357/74, 70, 68, 69

[56] References Cited

U.S. PATENT DOCUMENTS 4,145,120  3/1979  Kubota ........................... 357/80
4,604,644  8/1986  Beckham et al. ............... 357/80

Primary Examiner—William D. Larkins
Assistant Examiner—Carl Whitehead, Jr.
Attorney, Agent, or Firm—John C. Fox

[57] ABSTRACT

For face-down bonding by means of (pressure) contacts interconnection structures (bumps) 3 are provided in rows or line arrangements (11) on a substrate 2. This leads to a better distribution of elastical tensions in the substrate 2 and to more reliable contacts.

29 Claims, 2 Drawing Sheets

SUBSTRATE AND DEVICE COMPRISING INTERCONNECTION STRUCTURES

BACKGROUND OF THE INVENTION

The invention relates to a substrate comprising a plurality of rows of electrically conducting interconnection structures for realising an electrical contact, particularly a pressure contact.

The invention also relates to a device in which such a substrate is mounted on a supporting body.

A substrate of the type described in the opening paragraph is described in Japanese Kokai 60-262430. The substrate is an integrated circuit, and is bonded to a supporting body by means of the so-called flip-chip technique (face-down bonding). The interconnection structures or bumps on the substrate establish an electrically conducting pressure contact with conductor tracks on the supporting body. The pressure contacts are maintained by means of a thermosetting resin between the supporting body and the integrated circuit, which resin is cured after establishing the contacts.

A problem with such connections is their thermal behaviour. Due to different coefficients of expansion of the resin, supporting body, substrate and materials of the interconnection structure (bump), curvatures may occur, notably in the substrate and the supporting body, so that the pressure at the area of the contacts is not constant. This gives rise to unreliable contacts.

SUMMARY OF THE INVENTION

A first substrate according to the invention is characterized in that the interconnection structures are exclusively present in at least one row, separated by a substantially equal mutual distance d, and in that the substrate has at least three parallel line arrangements comprising at least one row of interconnection structures, which line arrangements are mutually spaced apart by at least the distance 5 d.

A second substrate according to the invention is characterized in that the interconnection structures are exclusively present in at least one row, separated by a substantially equal mutual distance d, and in that the substrate has at least two parallel line arrangements comprising at least two rows of interconnection structures in one line arrangement, which line arrangements are mutually spaced apart by at least the distance 5 d.

The invention is based on the recognition that the provision of pressure contacts in a plurality of rows or line arrangements by means of different pressure methods leads to an optimum distribution of the elastic tensions in the substrate or in an elastic medium coupled thereto, and of the elastic tensions in the supporting body. The pressure contacts arranged in rows (line arrangements) remain substantially coplanar, while the substrate and/or the supporting body between the rows (line arrangements) are deformed. Moreover, a portion of the pressure distribution may already be absorbed in elastic media mechanically coupled to the substrate or the supporting body.

The pressure for the pressure contacts can be maintained by, for example adhesive bonds or by means of a clamping construction.

An interconnection structure as described in simultaneously filed U.S. patent application Ser. No. 07/496394 is preferably chosen for use in the present invention. A preferred embodiment of a substrate according to the invention is therefore characterized in that an interconnection structure has its largest height along its circumference and in that its surface area is provided with spherical projections substantially along its circumference at least in the area of largest height.

The interconnection structure is preferably circular, with a maximum diameter of 100 μm, and with a maximum height of 10 μm viewed in a cross-section. Other shapes (square, hexagonal, octagonal) are alternatively possible.

The substrate is preferably a semiconductor body, for example silicon, in which an integrated circuit is embodied, while the supporting body may be made of glass or quartz and may in its turn form a supporting plate for a liquid crystal display device. Ceramic material, synthetic resin or polyimide may also be chosen as a material for the supporting body.

BRIEF DESCRIPTION OF THE DRAWING

The invention will now be described in greater detail with reference to some embodiments and the accompanying drawing in which.

DESCRIPTION OF THE PREFERRED EMBODIMENTS

Figure 1:
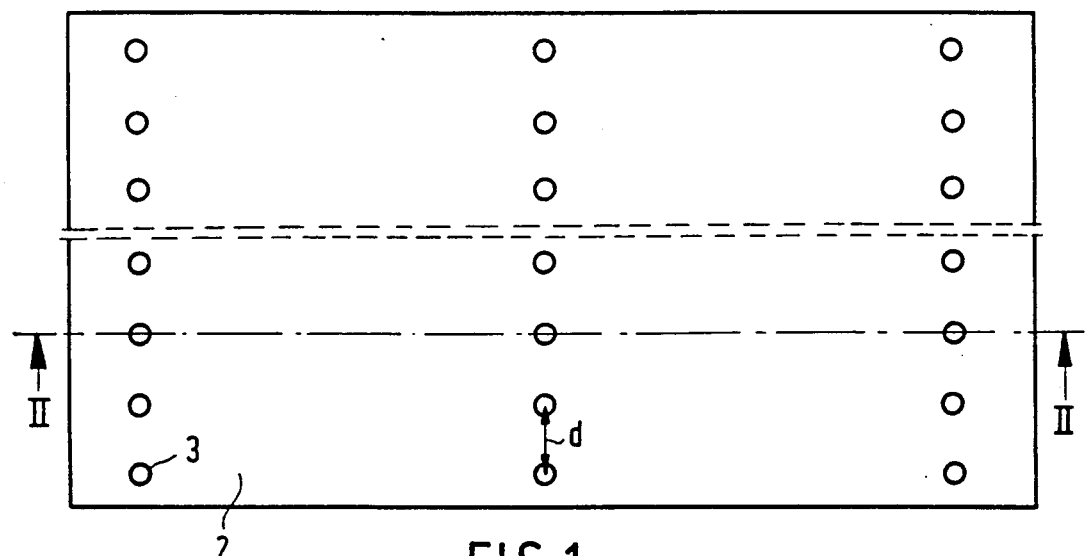
FIG. 1 is a diagrammatic plan view of a substrate according to the invention.

FIG. 1 is a plan view of one embodiment of the distribution of interconnection structures (bumps) 3 on a substrate 2, for example a semiconductor body (IC). According to the invention, bumps 3 are arranged in rows, in this example single parallel rows, at a mutual distance d, while the distance between rows is approximately 5 d. The substrate incorporates, for example an integrated circuit in which the bumps are present at the areas of bonding pads for external connections. In this example the bumps 3 are formed with a raised edge and smooth spherical projections as described in simultaneously filed copending Application, Attorney docket Ser. No. 07/496,394. This renders such bumps particularly suitable for pressure contacts. As described in application Ser. No. 07/496,394, which is herein incorporated by reference, the interconnection structures (bumps) 3 are preferably circular and have a maximum diameter of 100 μm, and a maximum height, viewed in a cross-section, of 6 μm.

Figure 2:
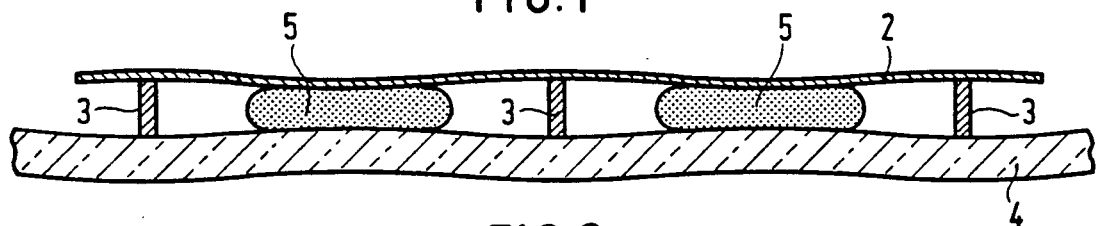
FIG. 2 is a diagrammatic cross-section taken on the line II—II in FIG. 1 of an assembly of the substrate and a supporting body to which it is secured by means of an adhesive bond.

FIG. 2 shows in a cross-section, an assembly of the substrate 2 with a supporting body 4 on which conductor tracks (not shown) are present. These tracks are connected in an electrically conducting manner via the bumps 3 to external terminals of an integrated semiconductor circuit embodied in the substrate 2 (of, for example silicon).

The pressure between the substrate 2 and the supporting body 4 is maintained at the area of the bumps 3 via adhesive bonds 5, e.g., a cured resin bond. Mechanical tensions in the substrate 2 as well as in the supporting body 4 of, for example glass, maintain the desired pressure at the area of the rows of bumps 3, provided that the variation of the thickness of the adhesive layer 5 due to changing ambient conditions (temperature, humidity) remains small with respect to the deformations caused by these mechanical tensions. The substantially constant pressure thus obtained maintains electrically conducting pressure contacts between the bumps 3 and conductor tracks on the supporting body 4. If desired, the adhesive layer 5 may extend over the entire surface area between the bumps 3.

Figure 3:
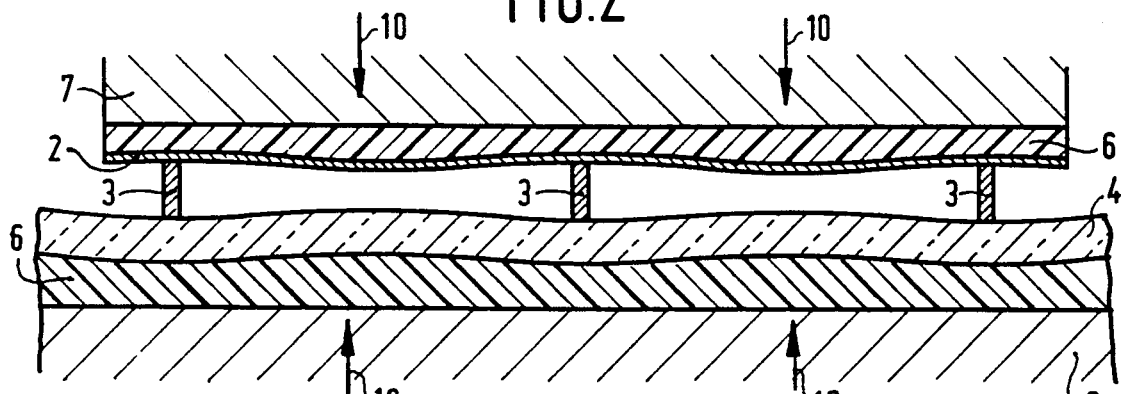
FIG. 3 shows diagrammatically the same assembly secured by means of a clamping construction.

In the assembly of FIG. 3 the pressure at the area of the bumps 3 is maintained by means of a clamping construction (shown diagrammatically by means of arrows 10) which clamps the plates 7, 8. An elastic medium 6 is present between the substrate 2 and the upper plate 7. An elastic medium 6 is also present between the supporting body 4 (glass plate, quartz plate) and the lower plate 8.

If the media 5, 6 are formed as thin layers, the pressure is concentrated at the area of the rows of bumps 3 (self-adapting construction).

In the case of thicker layers the pressure is substantially proportionally distributed. Elastic deformations of the substrate or the supporting body mainly occur between the rows of bumps. The resultant tensions tend to increase the pressure at the area of the rows of bumps.

Figure 4:
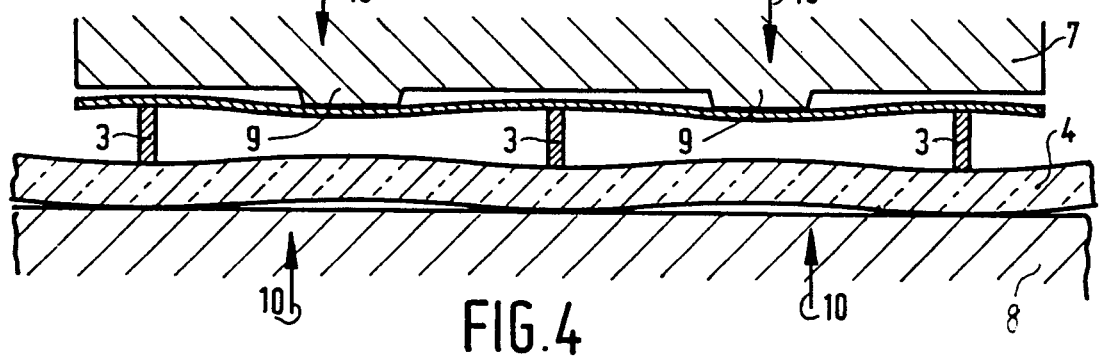
FIG. 4 shows diagrammatically a modification of the assembly of FIG. 3.

FIG. 4 shows an assembly in which the elastic medium 6 is omitted but in which the upper plate 7 has projections 9 between the rows of bumps 3. The projections 9 cause such tensions in the substrate 2 that a constant pressure is maintained at the area of the rows of bumps (comparable with the situation of FIG. 2). If necessary, an elastic medium may be provided between the supporting body 4 and the lower plate 8.

Figure 5:
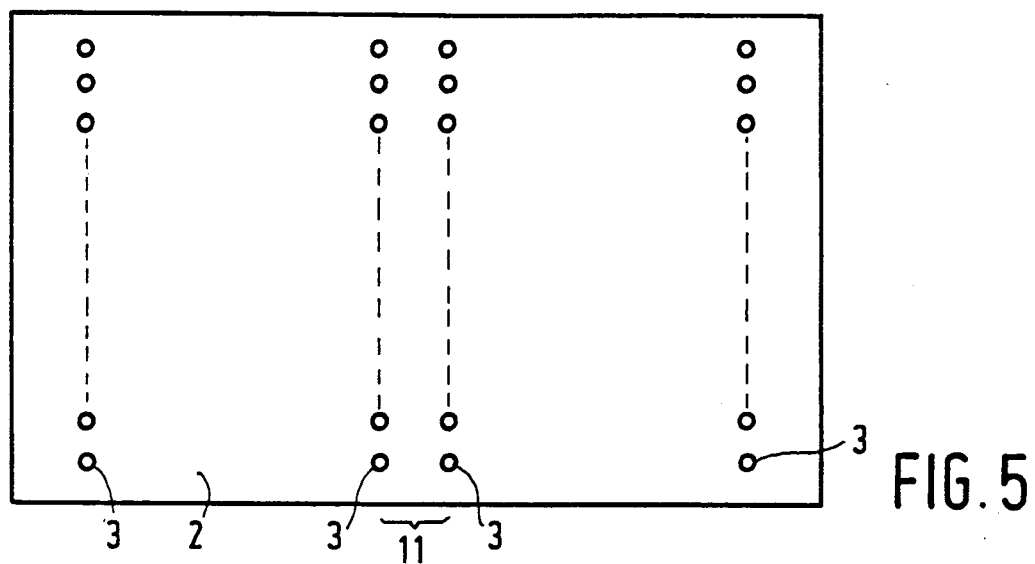
FIGS. 5 through 7 show various arrangements of the interconnection structures on the substrate.
Figure 6:
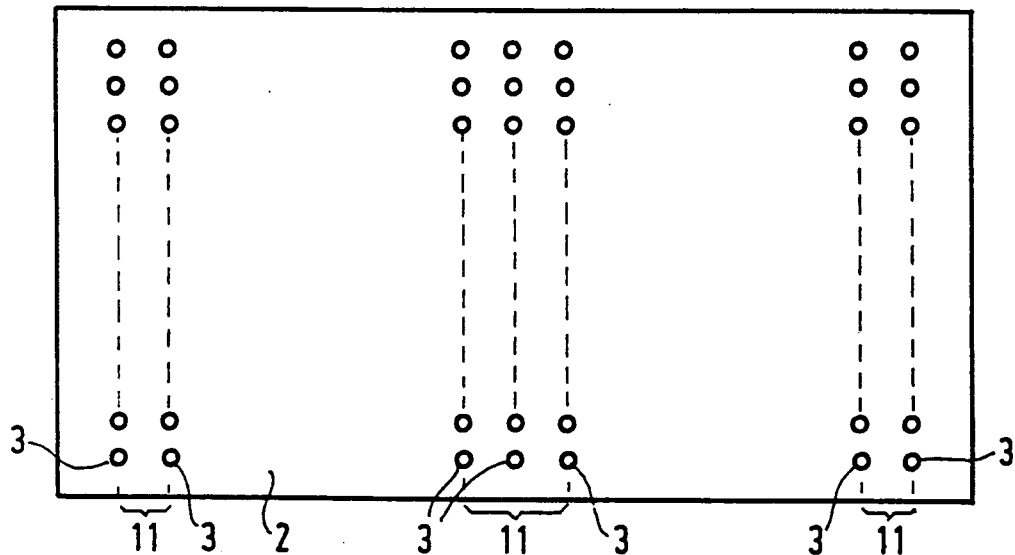

FIG. 5 shows another distribution of the bumps 3 across the substrate 2, with the central line arrangement 11 comprising two rows of bumps 3. This has the same advantages as are realised in the assembly shown in FIGS. 1 to 4. The number of line arrangements as well as the number of rows per line arrangement may of course be extended, as shown for example diagrammatically in FIG. 6.

Figure 7:
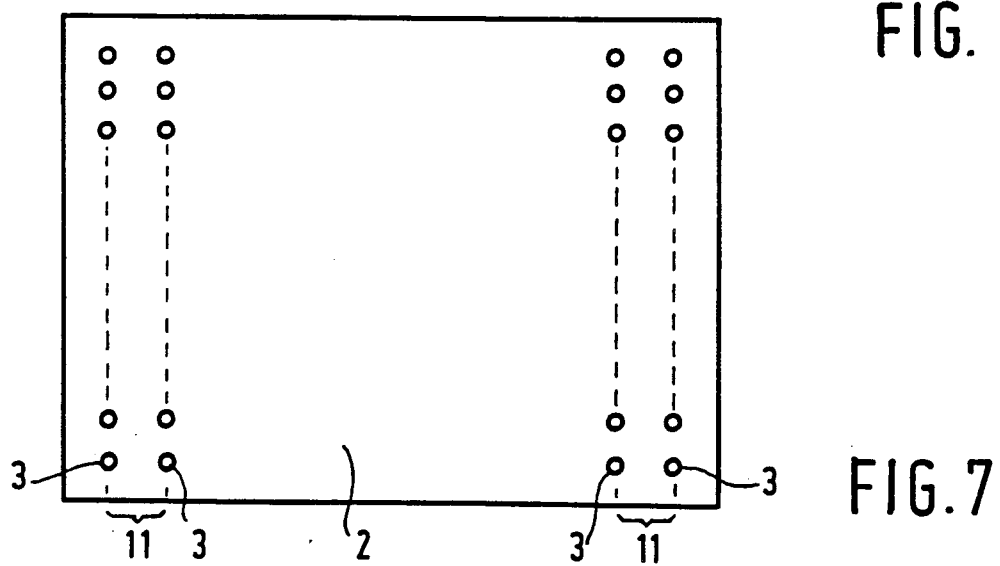

The said advantages may also be realised with the distribution according to FIG. 7 in which the substrate 2 has only two line arrangements 11 of two (or, if necessary, more) rows of bumps 3.

The above-described construction may be used advantageously for "face-down bonding" of ICs with many external terminals on hard substrates such as, for example glass or quartz substrates. The glass or quartz may form part of a larger assembly such as, for example a (liquid crystal) display device, but it may also be used as a supporting body for a number of electronic circuit elements, one or more of which are secured to the supporting body by means of the face-down bonding method.

Although pressure contacts have been described in the embodiments, the advantages described may also be realised for adhesive contacts.

We claim:

1. A substrate comprising a plurality of rows of electrically conducting interconnection structures for realising an electrically conducting contact, particularly a pressure contact, characterized in that the interconnection structures are exclusively present in at least three parallel line arrangements each comprising at least one row of interconnection structures separated by a substantially equal mutual distance d, which line arrangements are mutually spaced apart by at least 5 d.

2. A substrate comprising a plurality of rows of electrically conducting interconnection structures for realising an electrically conducting contact, particularly a pressure contact, characterized in that the interconnection structures are exclusively present in at least two parallel line arrangements each comprising at least two rows of interconnection structures separated by a substantially equal mutual distance d, which line arrangements are mutually spaced apart by at least 5 d.

3. A substrate as claimed in claim 1, characterized in that at least one line arrangement comprises only one row of interconnection structures.

4. A substrate as claimed in claim 1, characterized in that each row comprises at least 6 interconnection structures.

5. A substrate as claimed in claim 1, characterized in that the mutual distance between two rows is at least 10 d.

6. A substrate as claimed in claim 1, characterized in that an interconnection structure has its largest height along its circumference and in that its surface is provided with spherical projections substantially along its circumference at least in the area of the largest height.

7. A substrate as claimed in claim 6, characterized in that the maximum height of the interconnection structure, viewed in cross-section, is 10 $\mu$m.

8. A substrate as claimed in claim 6, characterized in that the interconnection structure, in a plan view, is of a substantially hexagonal, octagonal or circular shape.

9. A substrate as claimed in claim 1, characterized in that the substrate comprises semiconductor material.

10. An assembly comprising a substrate as claimed in claim 1 and a supporting body provided with a conductor pattern, characterized in that the conductor pattern is connected electrically to the substrate via pressure contact with the interconnection structures.

11. An assembly as claimed in claim 10, characterized in that the pressure is maintained for the pressure contacts by means of an adhesive or resin layer between the substrate and the supporting body.

12. An assembly as claimed in claim 10, characterized in that the pressure for the pressure contacts is maintained by clamping means.

13. An assembly as claimed in claim 12, characterized in that an elastic medium is present between the supporting body and the clamping means.

14. An assembly as claimed in claim 12, characterized in that an elastic medium is present between the substrate and the clamping means.

15. An assembly as claimed in claim 12, characterized in that the clamping means for the substrate comprises a plate with projections facing the substrate between the line arrangements.

16. An assembly as claimed in claim 10, characterized in that the supporting body is made of glass, quartz, ceramic material, polyimide or synthetic resin.

17. A substrate as claimed in claim 2, characterized in that each row comprises at least 6 interconnection structures.

18. A substrate as claimed in claim 3, characterized in that each row comprises at least 6 interconnection structures.

19. A substrate as claimed in claim 2, characterized in that the mutual distance between two rows is at least 10 d.

20. A substrate as claimed in claim 3, characterized in that the mutual distance between two rows is at least 10 d.

21. A substrate as claimed in claim 4, characterized in that the mutual distance between two rows is at least 10 d.

22. A substrate as claimed in claim 2, characterized in that an interconnection structure has its largest height along its circumference and in that its surface is provided with spherical projections substantially along its circumference at least in the area of the largest height.

23. A substrate as claimed in claim 3, characterized in that an interconnection structure has its largest height along its circumference and in that its surface is provided with spherical projections substantially along its circumference at least in the area of the largest height.

24. A substrate as claimed in claim 4, characterized in that an interconnection structure has its largest height along its circumference and in that its surface is provided with spherical projections substantially along its circumference at least in the area of the largest height.

25. A substrate as claimed in claim 5, characterized in that an interconnection structure has its largest height along its circumference and in that its surface is provided with spherical projections substantially along its circumference at least in the area of the largest height.

26. A substrate as claimed in claim 7, characterized in that the interconnection structure, in a plan view, is of a substantially hexagonal, octagonal or circular shape.

27. An assembly as claimed in claim 13, characterized in that an elastic medium is present between the substrate and the clamping means.

28. An assembly as claimed in claim 13, characterized in that the clamping means for the substrate comprises a plate with projections facing the substrate between the line arrangements.

29. An assembly as claimed in claim 11, characterized in that the supporting body is made of glass, quartz, ceramic material, polyimide or synthetic resin.

* * * * *